(12) United States Patent
Lin et al.

(10) Patent No.: US 9,153,462 B2
(45) Date of Patent: Oct. 6, 2015

(54) SPIN CHUCK FOR THIN WAFER CLEANING

(75) Inventors: Yu-Liang Lin, Hsin-Chu (TW);
Weng-Jin Wu, Hsin-Chu (TW);
Jing-Cheng Lin, Hsin-Chu (TW);
Wen-Chih Chiou, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1050 days.

(21) Appl. No.: 12/964,097

(22) Filed: Dec. 9, 2010

(65) Prior Publication Data

US 2012/0145204 A1    Jun. 14, 2012

(51) Int. Cl.
*H01L 21/687* (2006.01)
*H01L 21/67* (2006.01)

(52) U.S. Cl.
CPC .... *H01L 21/67051* (2013.01); *H01L 21/68728* (2013.01)

(58) Field of Classification Search
None
See application file for complete search history.

(56) References Cited

U.S. PATENT DOCUMENTS

| | | |
|---|---|---|
| 3,841,031 A | 10/1974 | Walsh |
| 5,391,917 A | 2/1995 | Gilmour et al. |
| 5,510,298 A | 4/1996 | Redwine |
| 5,605,866 A * | 2/1997 | McClanahan et al. ......... 438/758 |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |

(Continued)

FOREIGN PATENT DOCUMENTS

| | | |
|---|---|---|
| CN | 1712333 A | 12/2005 |
| CN | 1765528 A | 5/2006 |

(Continued)

*Primary Examiner* — Jason Ko
(74) *Attorney, Agent, or Firm* — Slater & Matsil, L.L.P.

(57) ABSTRACT

A device and system for thin wafer cleaning is disclosed. A preferred embodiment comprises a spin chuck having at least three holding clamps. A thin wafer with a wafer frame is mounted on the spin chuck through a tape layer. When the holding clamps are unlocked, there is no interference with the removal and placement of the wafer frame. On the other hand, when the holding clamps are locked, the holding clamps are brought into contact with the outer edge of the wafer frame so as to prevent the wafer frame from moving laterally. Furthermore, the shape of the holding clamps in a locked position is capable of preventing the wafer frame from moving vertically.

20 Claims, 11 Drawing Sheets

(56) References Cited

U.S. PATENT DOCUMENTS

| | | |
|---|---|---|
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,322,787 B2 | 1/2008 | Hashimoto |
| 7,335,090 B2 | 2/2008 | Takahashi |
| 7,335,972 B2 | 2/2008 | Chanchani |
| 7,355,273 B2 | 4/2008 | Jackson et al. |
| 7,848,844 B2 | 12/2010 | Nemoto |
| 2005/0054274 A1 | 3/2005 | Kajiyama |
| 2006/0000494 A1 | 1/2006 | Garcia et al. |

FOREIGN PATENT DOCUMENTS

| | | |
|---|---|---|
| CN | 101030528 A | 9/2007 |
| TW | 200614326 | 5/2006 |
| TW | 200919570 A | 5/2009 |

* cited by examiner

US 9,153,462 B2

SPIN CHUCK FOR THIN WAFER CLEANING

BACKGROUND

Emerging applications, such as radio frequency identification (RFID) integrated circuits, high density memory devices have an increasing demand for thin semiconductor devices. Thin semiconductor devices, and the like, enable more sophisticated manufacturing technologies, including micro-electro-mechanical systems (MEMS), through-silicon via (TSV) and novel 3D packaging technologies.

In the manufacturing process of thin semiconductor devices, an important step is thin wafer cleaning after the semiconductor manufacturing process. For example, after a chemical-mechanical polishing process, some residues such as carbon or adhesive films and particles may stay on the surface of the thin wafer. These films and particles may cause surface roughness leading to defects in subsequent fabrication processes, such as a defect in the photolithography process due to the uneven surface of the wafer.

In the conventional art, wet wafer cleaning is commonly employed to remove unwanted residues by spraying various cleaning chemical solvents on a wafer. When a wafer is in this wafer cleaning process, it may be directly placed on a vacuum chuck and then a variety of spray nozzles spray chemical solvents first onto the wafer while the vacuum chuck is spinning. After carbon and adhesive films and particles are dissolved or decomposed, the chemical solvents wash dislodged films and particles away from the wafer. In the last step of the cleaning process, de-ionized water is sprayed while the wafer is spinning to allow complete cleaning.

However, thin wafers are fragile and must be supported over their full dimensions to prevent unnecessary damage. A common method of protecting a thin wafer involves using an adhesive layer to temporarily bond the thin wafer on a plate and employing a wafer frame to prevent the thin wafer from moving laterally. As such, it is desirable to clean a thin wafer while the thin wafer is bonded on a tape layer and protected by a wafer frame.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a spin chuck for thin wafer cleaning. The invention may also be applied, however, to various wafer cleaning processes.

Figure 1:
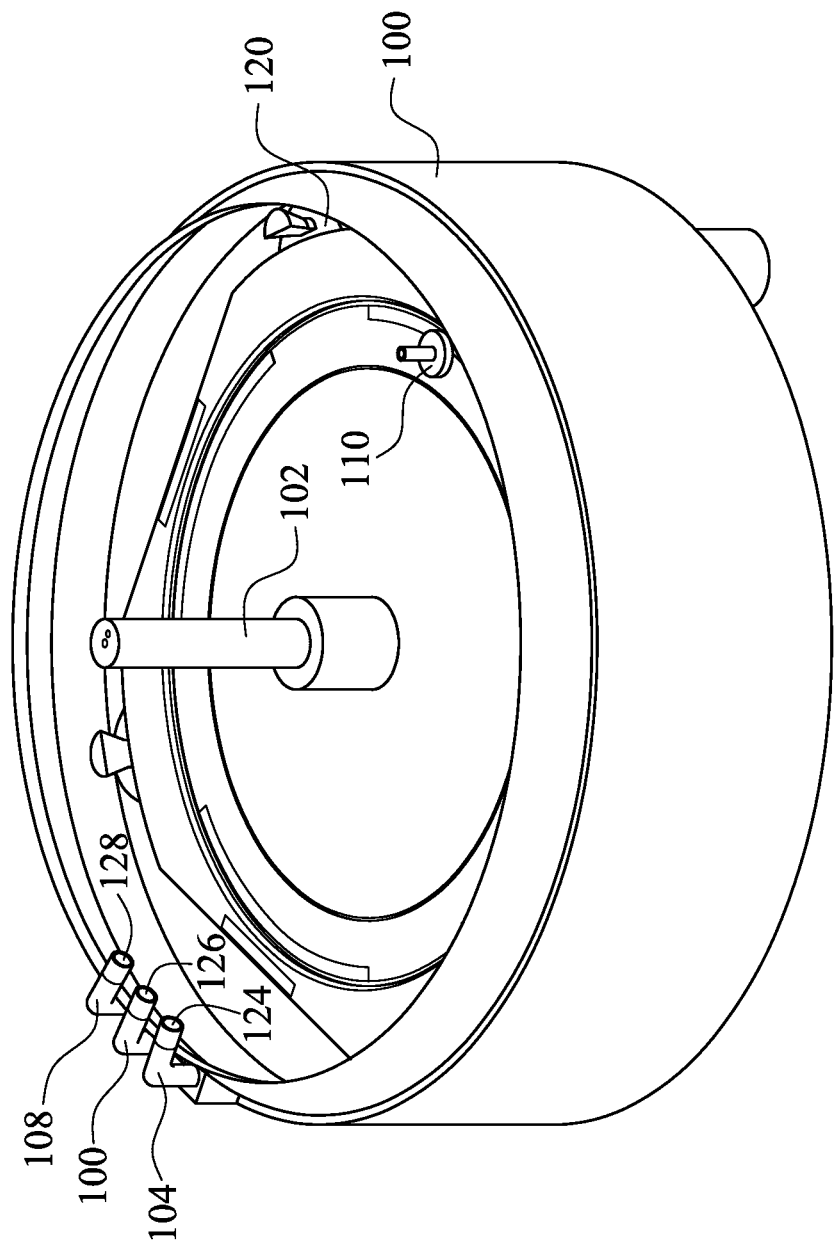
FIG. 1 is a perspective view of a thin wafer cleaning apparatus.

Referring initially to FIG. 1, FIG. 1 is a perspective view of a thin wafer cleaning apparatus. The thin wafer cleaning apparatus includes a cup 100. A spin chuck 120 is placed inside the cup 100. A pipe 104 is attached to the outer wall of the cup 100. The pipe 104 is connected to a spray nozzle 124 located inside the cup 100 by passing through the cup wall. Likewise, pipes 106 and 108 run along the pipe 104. They are connected to spray nozzles 126 and 128 respectively. Three spray nozzles 124, 126 and 128 are attached to the inner wall of the cup 100 and positioned above the spin chuck 120.

In an embodiment, the spray nozzle 124 supplies air; the spray nozzle 126 supplies pressurized de-ionized water. The spray nozzle 128 functions as a mixing manifold in which de-ionized water and surfactant are pressure-mixed and directed as a dispersed spray when the spray nozzle 128 is turned on. The thin wafer cleaning apparatus further includes a chemical solvent nozzle 102. The chemical solvent nozzle 102 is positioned above the spin chuck 120. In an embodiment, the chemical solvent nozzle 102 supplies pressurized chemical solvents and nitrogen for thin wafer cleaning. The detailed operation of the chemical solvent nozzle 102 will be described with respect to FIG. 9B. A waste chemical absorber 110 is disposed on the spin chuck 120. The detailed operation of the waste chemical absorber 110 will be shown and described in more detail below with regard to FIG. 9C.

However, as one of ordinary skill in the art will recognize, this thin wafer cleaning apparatus is only illustrative of a single suitable method for applying process liquid and collecting waste liquid during a thin wafer cleaning process. Any other suitable method, such as ultrasonic cleaning, may alternatively be utilized. All of these methods are fully intended to be included within the scope of the present disclosure.

Figure 2A:
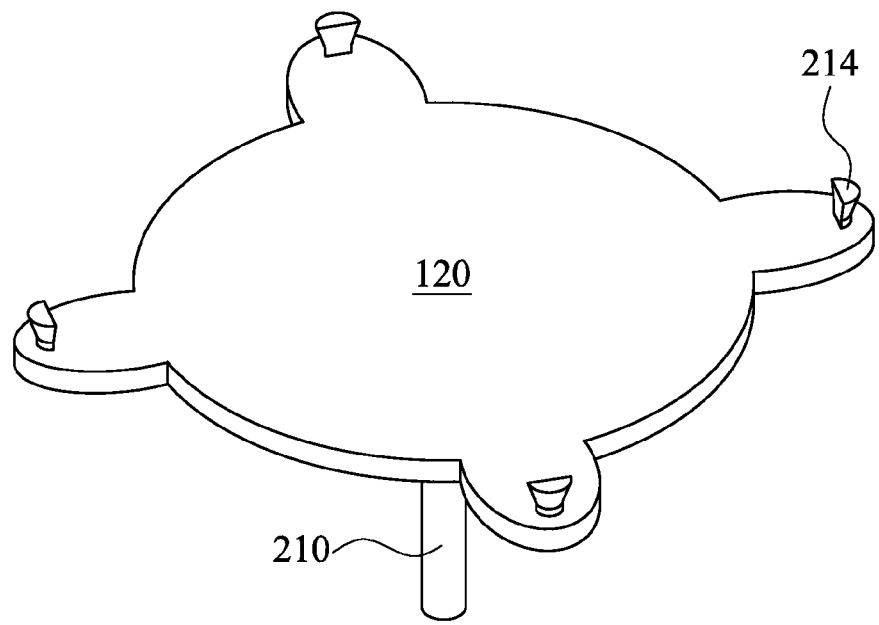
FIGS. 2A and 2B illustrate a perspective view of a spin chuck for thin wafer cleaning in accordance with an embodiment.
Figure 2B:
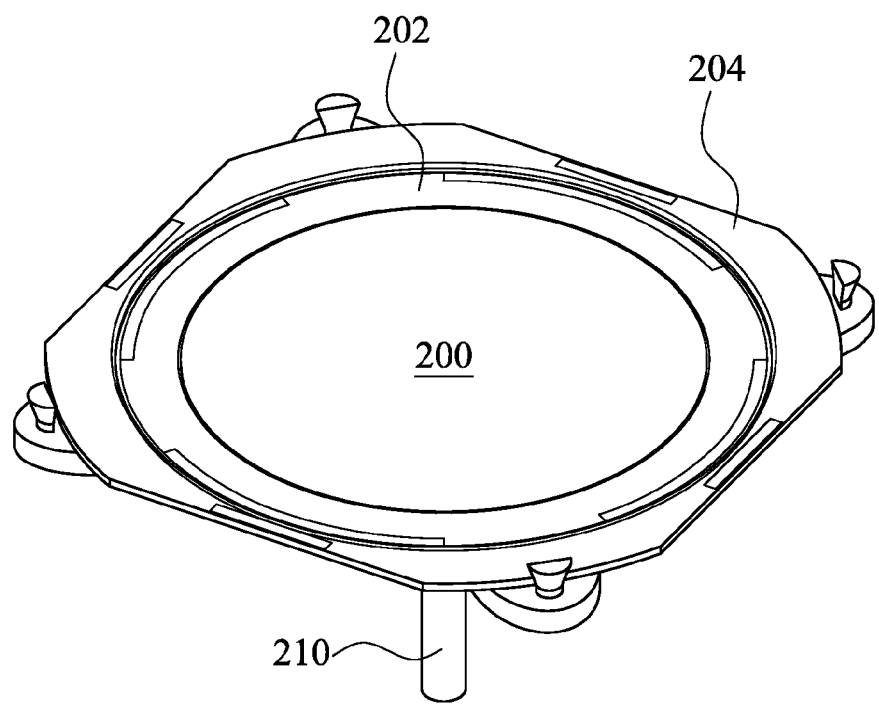

The spin chuck 120 depicted in FIG. 1 is illustrated in FIG. 2A in a perspective view in accordance with an embodiment. The backside of the spin chuck 120 is connected to a rotational drive shaft 210, which is from a rotation mechanism, such as a motor. On the front side of the spin chuck 120, four holding clamps 214 are disposed equally to surround the wafer (no shown in FIG. 2A but illustrated in FIG. 2B). The holding clamps 214 can be locked by rotating them by 180 degrees. As illustrated in FIG. 2B, a thin wafer 200 is mounted on the front side of spin chuck 120 through a tape layer 202. According to an embodiment, the diameter of the thin wafer 200 is about 300 mm. The diameter of the tape layer 202 is larger than the diameter of the thin wafer 200. The thin wafer 200 is placed in the middle of the tape layer 202. The thin wafer 200 and the tape layer 202 form a donut-shaped area, in which the thin wafer 200 occupies the cavity of the donut-shaped area.

A wafer frame 204 is donut-shaped having an outer diameter of approximately 400 mm and an inside diameter slightly less than the diameter of the tape layer 202. The wafer frame 204 is placed on the outer periphery of the tape layer 202. The holding clamps 214 are spaced uniformly around the edge of the wafer frame 204 so as to horizontally hold the wafer frame 204 when they are locked. The operation of the holding clamps 214 will be described in further detail with respect to FIGS. 5A-5D.

It should be recognized that while FIG. 2A illustrates the spin chuck 120 with four holding clamps uniformly spaced around the edge of the wafer frame 204, the spin chuck 120 could accommodate any number of holding clamps. Furthermore, a plurality of holding clamps may be spaced non-uniformly around the edge of the wafer frame 204. The number of holding clamps and uniform spacing illustrated herein are limited solely for the purpose of clearly illustrating the inventive aspects of the various embodiments. The present invention is not limited to any specific number of holding clamps and uniform spacing.

Figure 3A:
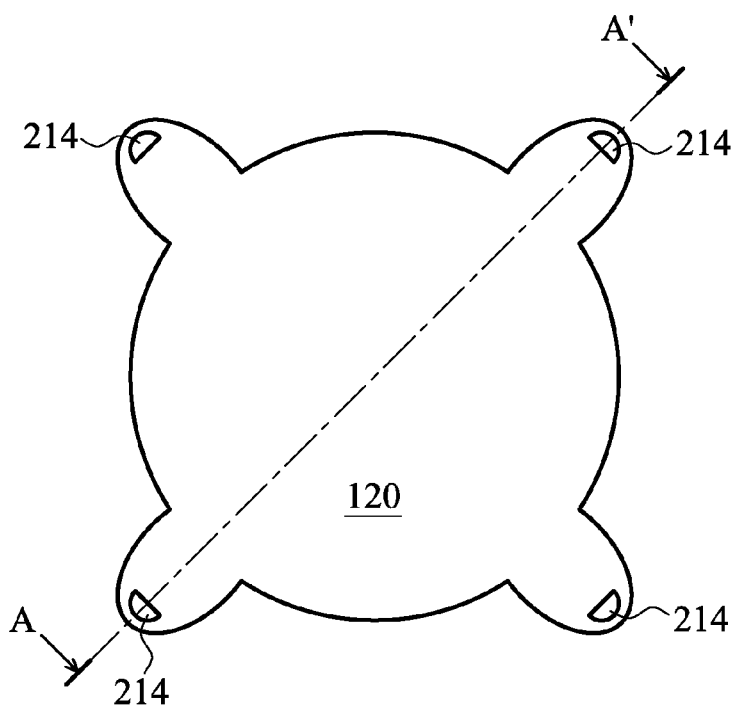
FIGS. 3A and 3B illustrate a top view of the spin chuck illustrated in FIG. 2A and a thin wafer mounted on top of the spin chuck for thin wafer cleaning.
Figure 3B:
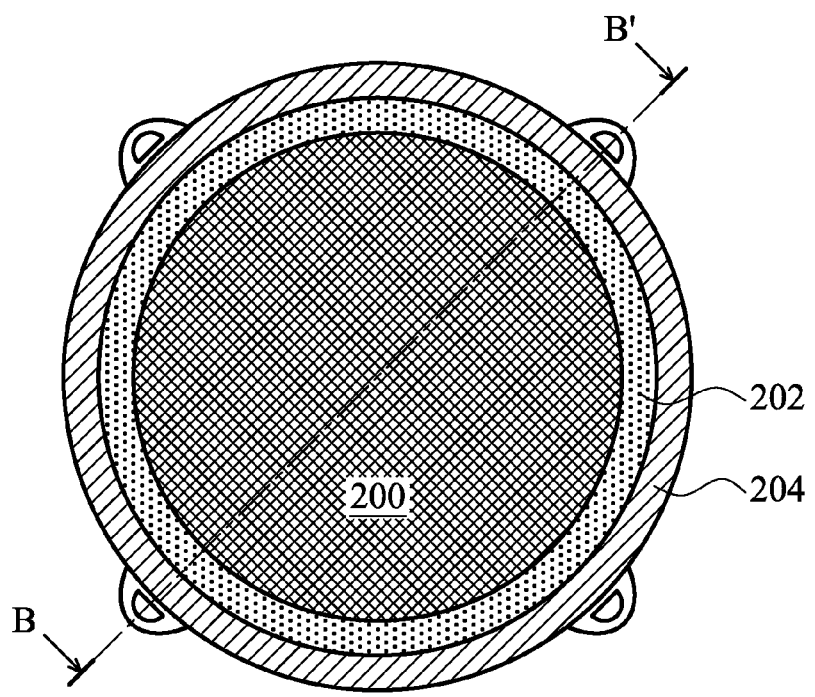

FIG. 3A illustrates a top view of the spin chuck 120 for thin wafer cleaning. The spin chuck's top surface includes a circular area having four half oval shaped extensions, which are uniformly spaced along the edge of the circle area. The holding clamp 214 is mounted on each oval shaped extension so that four evenly spaced holding clamps can firmly hold the wafer frame 204 when they are locked. FIG. 3B illustrates a top view of the thin wafer 200 mounted on the spin chuck 120. The tape layer 202 is brought into contact with both the spin chuck 120 and the thin wafer 200 so as to prevent the thin wafer 200 from moving vertically. The wafer frame 204 is mounted on the outer periphery of the tape layer 202 so that four holding clamps 214 can hold the wafer frame 204 when they are locked and then prevent the thin wafer 200 from dropping out from the spin chuck due to the centrifugal force when the spin chuck 120 rotates at a high speed.

Figure 4A:
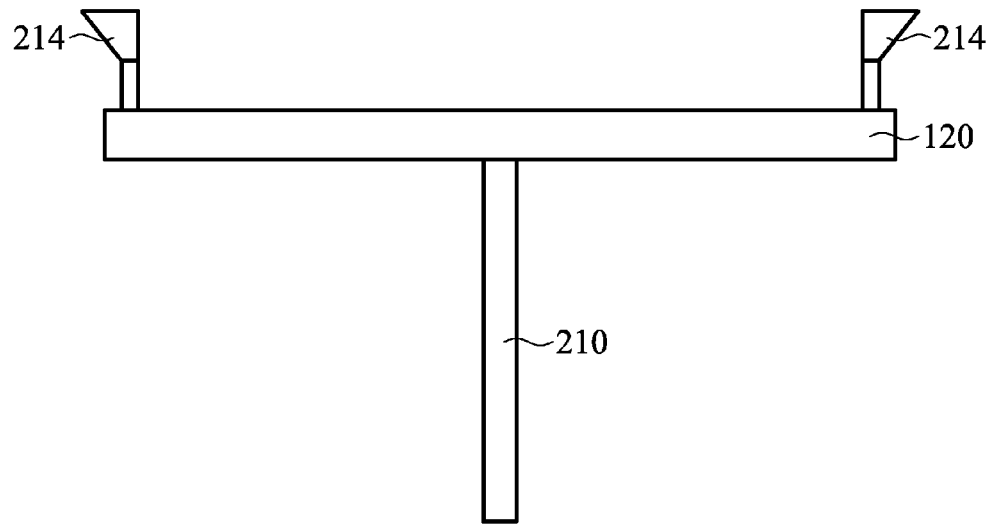
FIG. 4A illustrates a cross-sectional view of the spin chuck along the line A-A' shown in FIG. 3A.
Figure 4B:
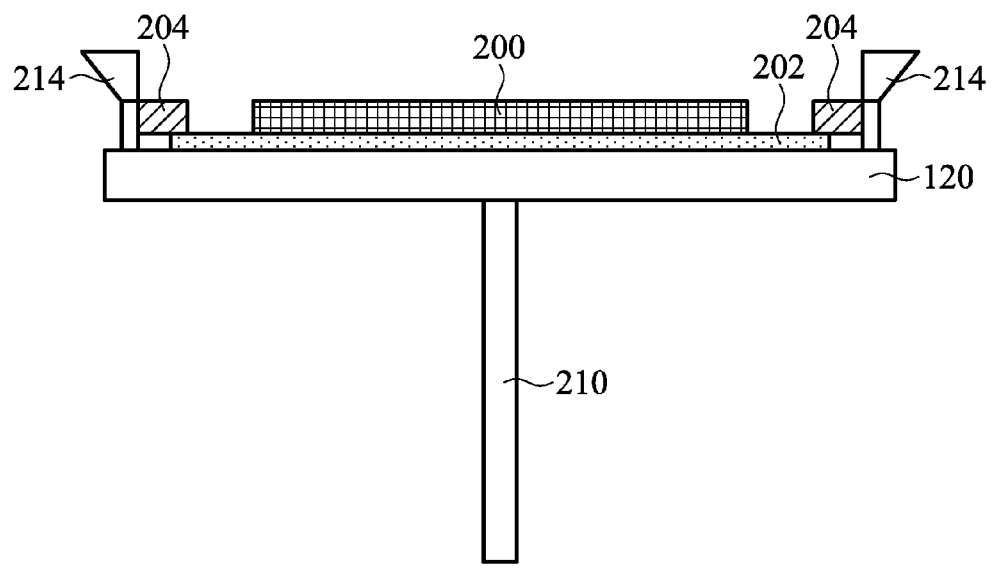
FIG. 4B illustrates a cross-sectional view of the spin chuck along the line B-B' shown in FIG. 3B.

FIG. 4A illustrates a cross-sectional view of the spin chuck 120 along the line A-A' shown in FIG. 3A. As described with respect to FIG. 2A, the backside of the spin chuck 120 is connected to the rotational drive shaft 210. The scale of the holding clamps 214 is exaggerated here to illustrate their geometry. The holding clamp 214 has two portions. The upper portion has a right trapezoidal shape. The bottom portion has a rectangular shape. It should be noted that the shapes of the upper and bottom portions are selected purely for demonstration purposes and are not intended to limit the various embodiments. One of ordinary skill in the art would recognize many variations, alternatives and modifications. As shown in FIG. 4B, when the holding clamps 214 are unlocked, that is, the acute triangle of the upper portion is turned to the outer edge of the spin chuck 120, the wafer frame 214 can be placed on the tape layer 204 because the outer diameter of the wafer frame 204 is slightly less than the distance between two unlocked holding clamps 214. In FIG. 4B, after the wafer frame 204 is mounted on top of the tape layer 202, there is a small gap between the outer edge of the wafer frame 204 and the holding clamps 214.

Figure 5A:
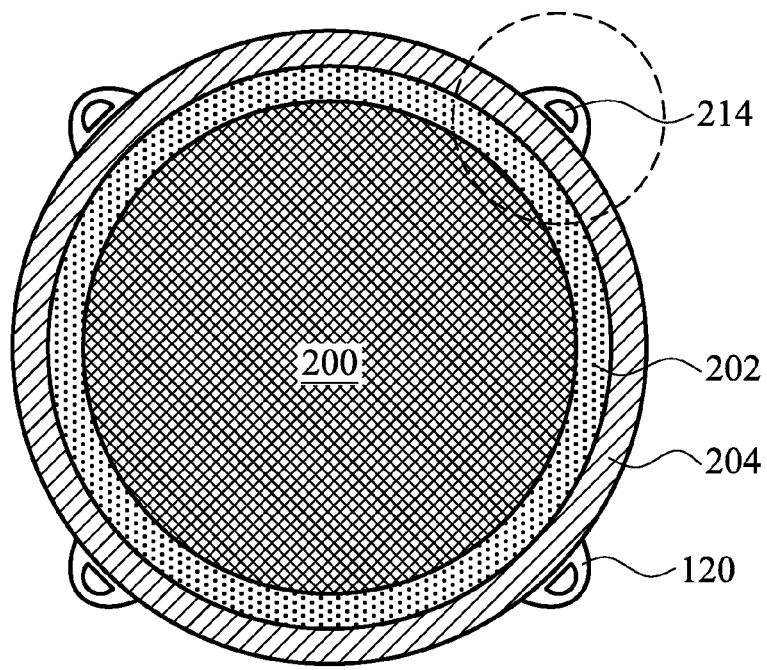
FIGS. 5A and 5B illustrate a top view of the spin chuck when four holding clamps are unlocked and locked respectively.

FIG. 5A illustrates a top view of the spin chuck 120 when four holding clamps 214 are unlocked. The detailed description of the spin chuck 120 and the thin wafer 200 placed on the top of the spin chuck 120 has been discussed with respect to FIG. 3B. A dashed circle is added in FIG. 5A to highlight the holding clamp 214 is unlocked. FIG. 5C is an enlarged perspective view of the holding clamp 214 and the wafer frame 204 shown in the dashed circle. As shown in FIG. 5C, before the holding clamp 214 is locked, there is a small gap between the outer edge of the wafer frame 204 and the edge of the holding clamp 214. The gaps between four holding clamps 214 and the wafer frame 204 guarantee there is no interference with the removal and placement of the wafer frame 204.

Figure 5B:
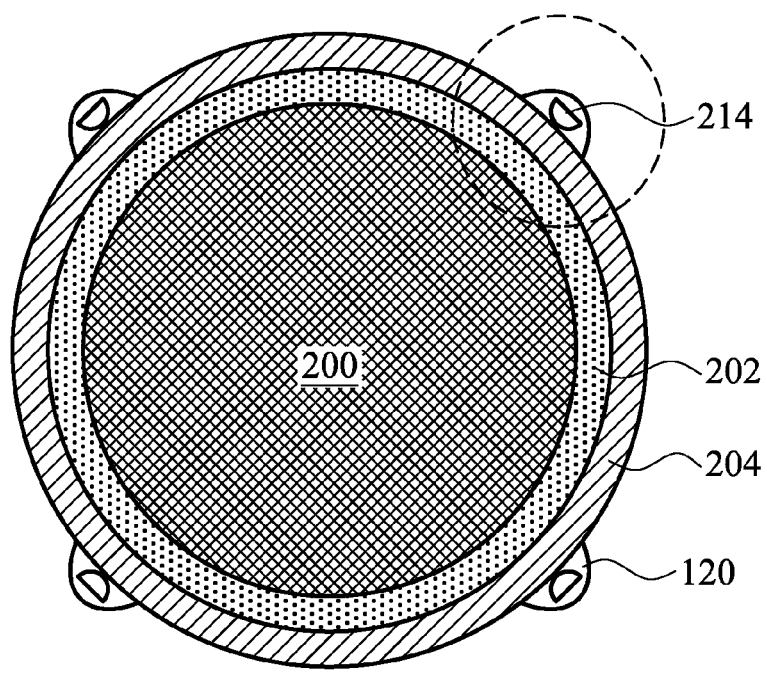
Figure 5C:
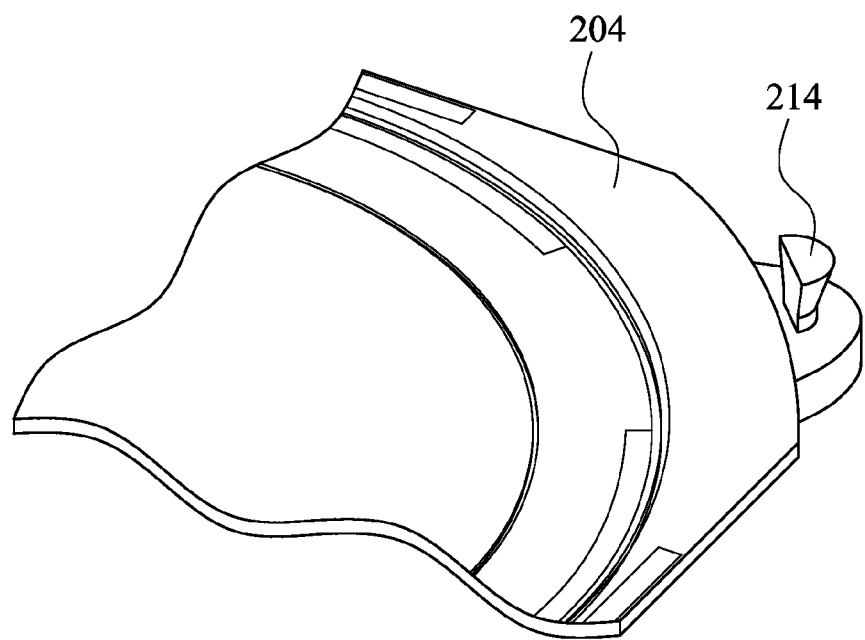
FIGS. 5C and 5D illustrate an enlarged perspective view of a holding clamp when it is unlocked and locked respectively.
Figure 5D:
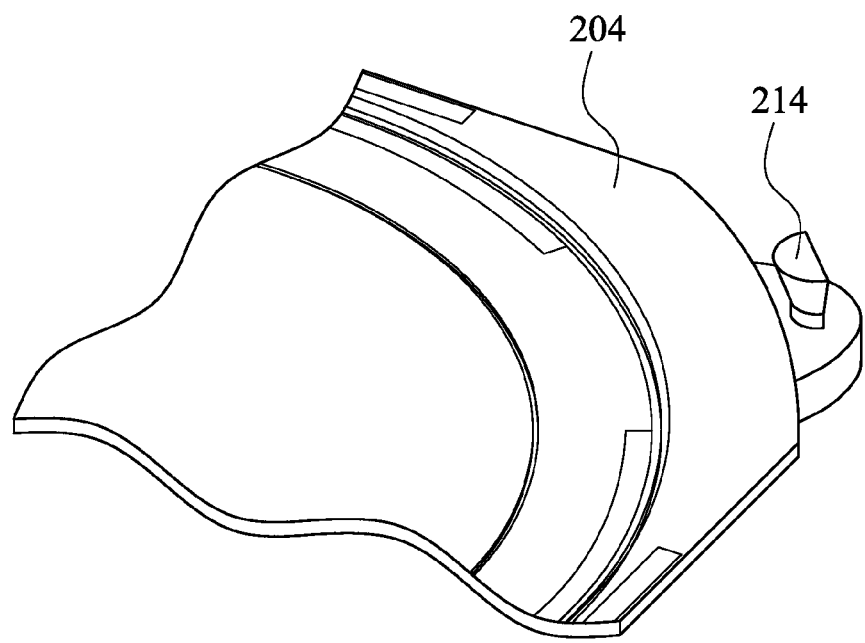

FIG. 5B illustrates a top view of the spin chuck 120 when four holding clamps 214 are locked. The area in dashed circle is enlarged in FIG. 5D. The holding clamp 214 can be turned in the horizontal plane substantially through 180 degrees from an unlocked position to a locked position. As shown in FIG. 5D, the bottom portion of the holding clamps is brought into contact with the edge of the wafer frame so as to prevent lateral movement of the wafer frame 204. Likewise, the upper portion of the holding clamp 214 is half-cup shaped. The U-shaped top of the upper portion is bigger than the top of the bottom portion. This is helpful to prevent the wafer frame 204 from moving vertically.

Figure 6:
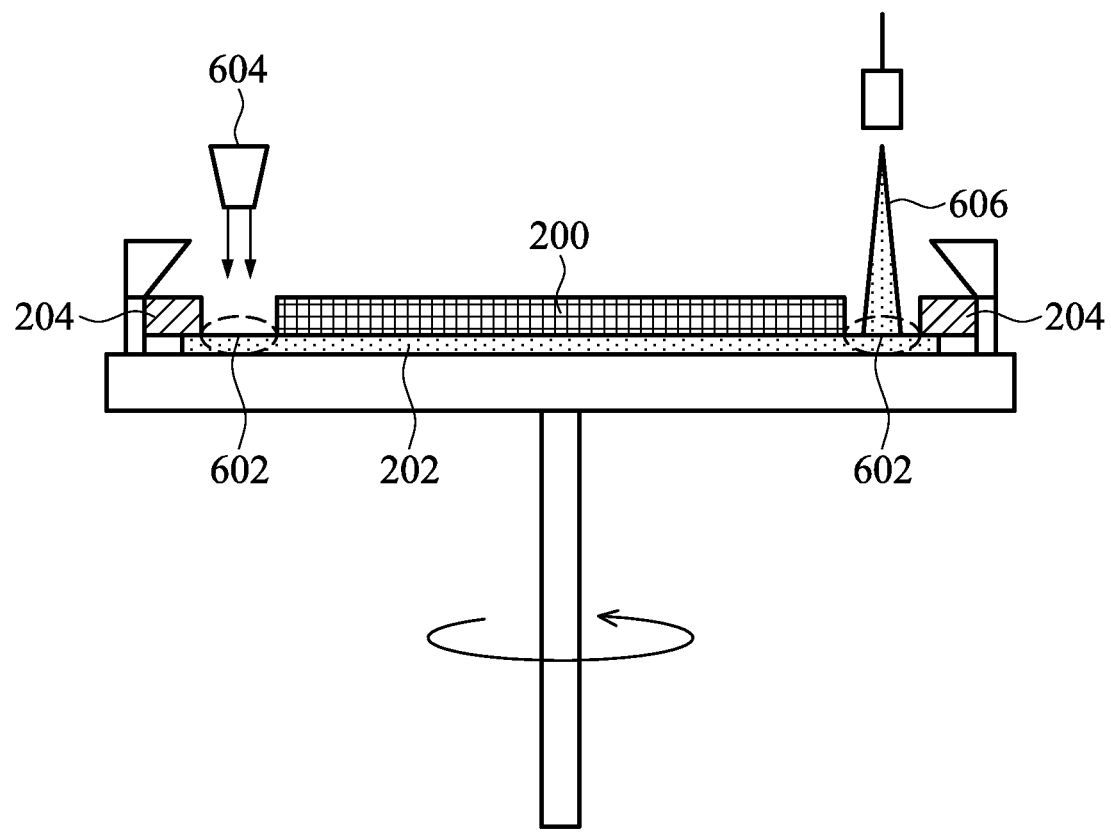
FIG. 6 illustrates a method of preventing carbon films and particles from staying on a tape layer.

FIG. 6 illustrates a method of preventing carbon films and particles from staying on the tape layer 202. As described above with respect to FIG. 2B, the tape layer 202 is placed underneath the thin wafer 200 and the wafer frame 204 is placed on the outer periphery of the tape layer 202. As shown in FIG. 6, there is a gap between the outer edge of the thin wafer 200 and the inner edge of the wafer frame 204. In FIG. 6, a region 602 is used to represent the tape layer region located within the gap. As shown in FIG. 6, the surface of the region 602 is lower than the surface of the thin wafer 200. During a cleaning process, all residues on top of the thin wafer 200 may flow down into the region 602 of the tape layer 202. The adhesive characteristic of the tape layer 202 may cause some residues staying on the tape layer 202. As a result, it causes a manufacture defect.

The manufacture defect can be resolved by applying a two-step cleaning method shown in FIG. 6. First, an ultraviolet lamp is used to reduce the adhesive strength of the region 602. As shown in FIG. 6, an ultraviolet lamp 604 is located above the region 602. When the spin chuck 120 rotates, the region 602 is exposed to ultraviolet cure, which can reduce the adhesive strength of the region 602 to near zero. Subsequently, a chemical solvent, such as Isopropyl Alcohol (IPA), acetone, alcohol or hydrocarbon mixture or the like, is sprayed on top of the region 602. The chemical solvent can remove adhesive from the region 602. As a result, the area 602 is free from adhesive. In the subsequent wafer cleaning processing, the residues flowing down from the thin wafer 200 may not stay on the region 602 because the adhesive material on top of the region 602 has been washed away. An advantageous feature of this tape adhesive removal method is that the non-adhesive surface between the thin wafer 200 and the wafer clamp 204 provides a drainage channel for residues and chemical solvents in the subsequent wafer cleaning processes.

Figure 7A:
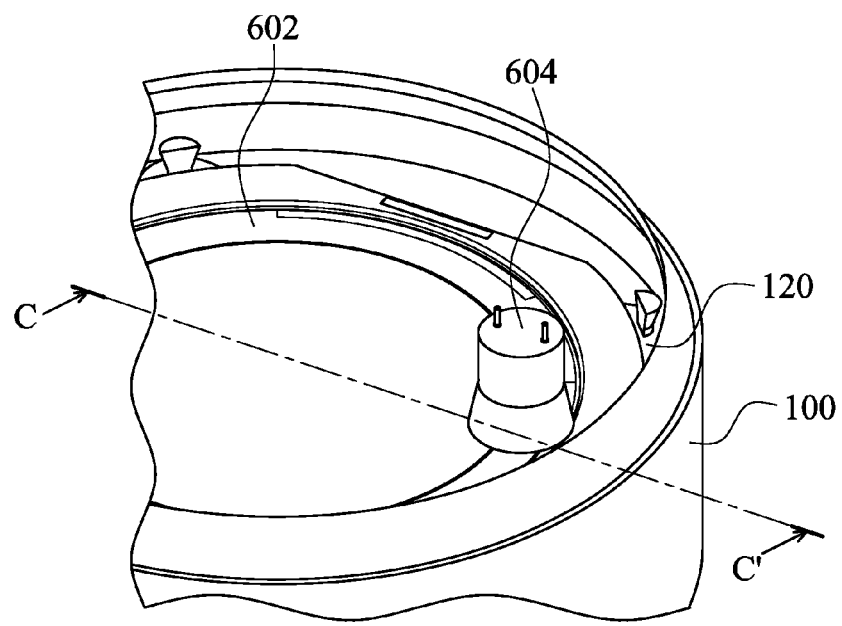
FIG. 7A is a perspective view of using a UV lamp to reduce the adhesive strength of a tape layer region.

FIG. 7A is a perspective view of an adhesive removal process. The ultraviolet lamp 604 is placed above the region 602 and covers a portion of the region 602. When the spin chuck 120 rotates, different areas of the region 602 periodically exposed to ultraviolet light until the adhesive strength of the region 602 is reduced to near zero.

Figure 7B:
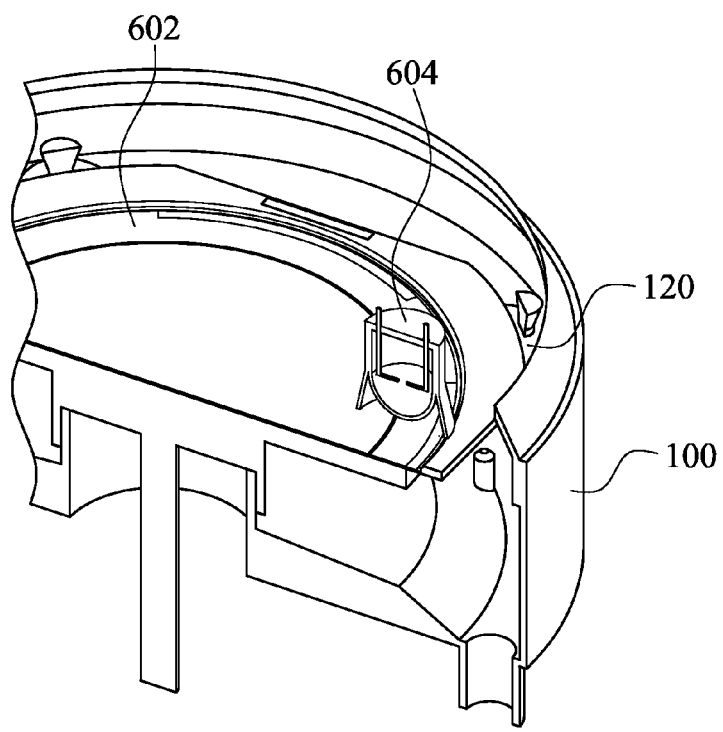
FIG. 7B is a cross sectional view taken along line C-C' of FIG. 7A.

FIG. 7B is a cross-sectional view of the ultraviolet lamp along line C-C'. In accordance with an embodiment, the ultraviolet lamp 604 may be positioned within the wafer cleaning cup 100. The ultraviolet lamp 604 can have an ultraviolet output power in the range between 10 mJ/cm² to 200 mJ/cm². The ultraviolet lamp 604 having this wavelength radiation range can reduce the adhesive strength of the surface of the region 602. As described above, the adhesive material on top of the tape layer 202 can be washed away by spraying chemical solvents onto the surface of the region 602. The region 602 may become a non-adhesive drainage channel for the subsequent wafer cleaning processes.

Figure 8:
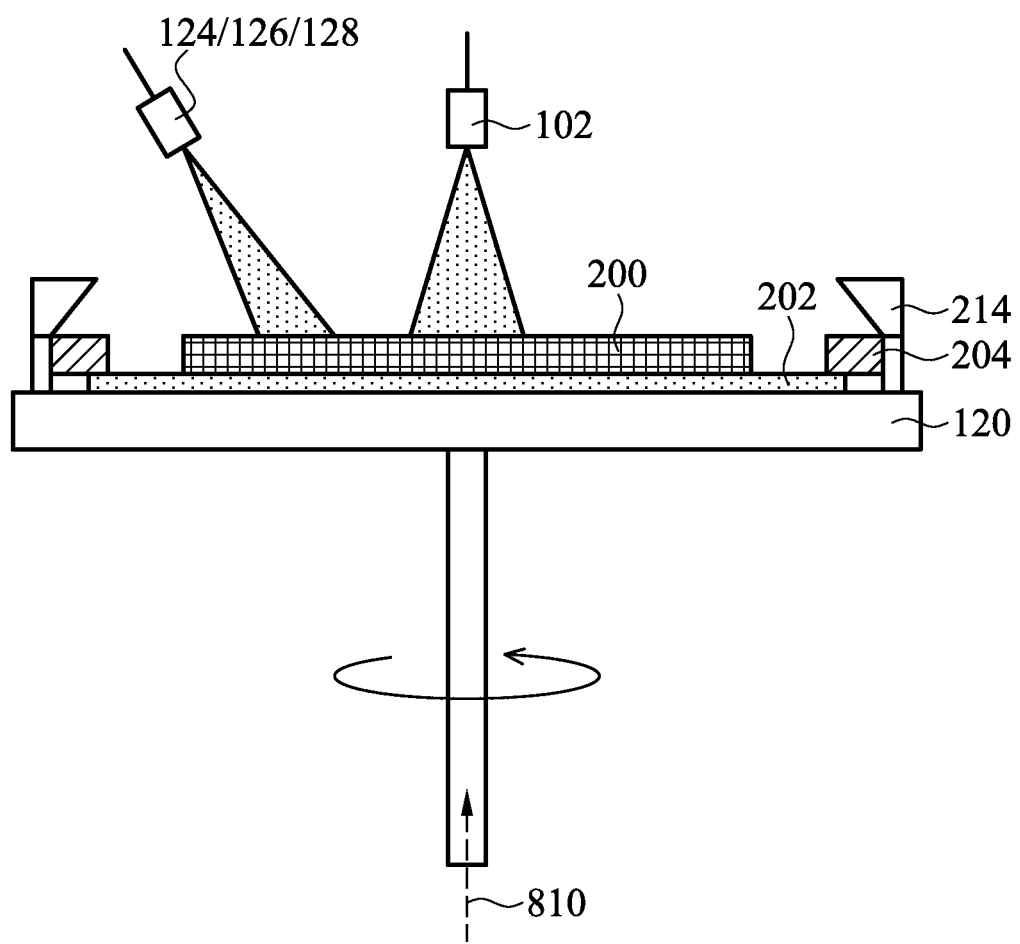
FIG. 8 illustrates a thin wafer cleaning process in accordance with an embodiment.

FIG. 8 illustrates a thin wafer cleaning process in accordance with an embodiment. The major residues on a thin wafer may include carbon and adhesive films and particles. In order to remove these films and particles, in accordance with an embodiment, the thin wafer cleaning process may include three steps. The first step is the removal of carbon films and particles. The second step is the removal of adhesive films and particles left on the wafer. These two removals can be accomplished by spraying chemical solvents through the chemical solvent nozzle 102. After these two removal processes, the thin wafer 200 goes through a final cleaning process.

As shown in FIG. 8, the thin wafer 200 is mounted on top of the tape layer 202, which prevents the thin wafer 200 from moving vertically or horizontally. In addition, holding clamps 214 in locked positions further prevent the thin wafer 200 from dropping off the spin chuck 120 due to the centrifugal force. The chemical solvent nozzle 102 is positioned above the thin wafer 200, substantially on an axis 810. The cleaning solvents are pressurized within a mixing manifold (not shown but illustrated in FIG. 9B) with nitrogen and sprayed on the thin wafer 200 through the chemical solvent nozzle 102. Alternatively, the chemical solvents may be atomized and then fed into the chemical solvent nozzle. Then, the chemical solvent nozzle 102 sprays the atomized chemical solvents onto the thin wafer. The spin chuck 120 spins about the axis 810 to spread the chemical solvents over the thin wafer 200. In accordance with an embodiment, the spin speed of the spin chuck 120 is between 500 and 1000 rpm, with a maximum speed of approximately 2000 rpm.

After removing carbon films and particles from the thin wafer, the chemical solvent nozzle 102 sprays pressurized chemical solvents again to remove the adhesive films and particles on top of the thin wafer. In order to effectively remove the adhesive materials, the chemical solvents are fed into a heater and heated up to a temperature in the range between 25° C. to 100° C. and then pressurized in the mixing manifold with nitrogen. Then the chemical solvent nozzle 102 sprays the heated and pressurized chemical solvents onto the thin wafer 200. Alternatively, chemical solvents can be fed into an ultrasonic vibration apparatus (not shown) and become ultrasonic vibration chemical solvents and then pressure-fed into a mixing manifold (not shown but illustrated in FIG. 9B) within the chemical solvent nozzle 102. The chemical solvent nozzle 102 sprays the ultrasonic vibration chemical solvents onto the thin wafer 200. The high-frequency sound waves from the ultrasonic vibration apparatus can dislodge the adhesive films and particles. The chemical solvents are good medium through which the dislodged films and particles are flowed down into a waste drain (not shown but illustrated in FIG. 9C).

The final cleaning process involves three nozzles attached on the inner wall of the cup. As described with respect to FIG. 1, three spray nozzles 124, 126 and 128 are attached to the inner wall of the cup 100 and positioned above the spin chuck 120. In an embodiment, the spray nozzle 124 supplies air; the spray nozzle 126 supplies de-ionized water. The spray nozzle 128 functions as a mixing manifold in which DI water and surfactant are pressure-mixed and directed as a dispersed spray when the spray nozzle 128 is turned on.

In accordance with various embodiments, the final cleaning process may involve the spray nozzle 124, the spray nozzle 126, the spray nozzle 128 or any combination thereof. In an embodiment, the spin chuck 120 rotates past the stationary spray nozzle 126. De-ionized water is sprayed on the spinning wafer through the spray nozzle 126. The spin chuck 120 spins about the axis 810 to spread de-ionized water over the wafer.

Figure 9A:
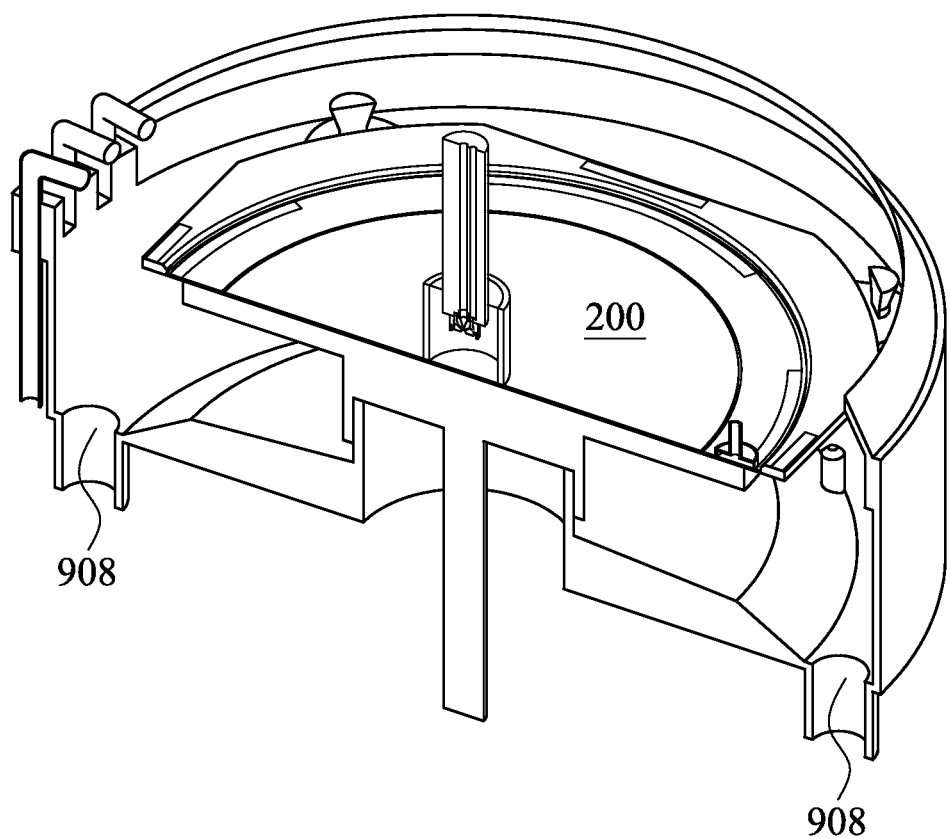
FIG. 9A illustrates a perspective view of a chemical solvent nozzle and a waste chemical solvent absorber.
Figure 9B:
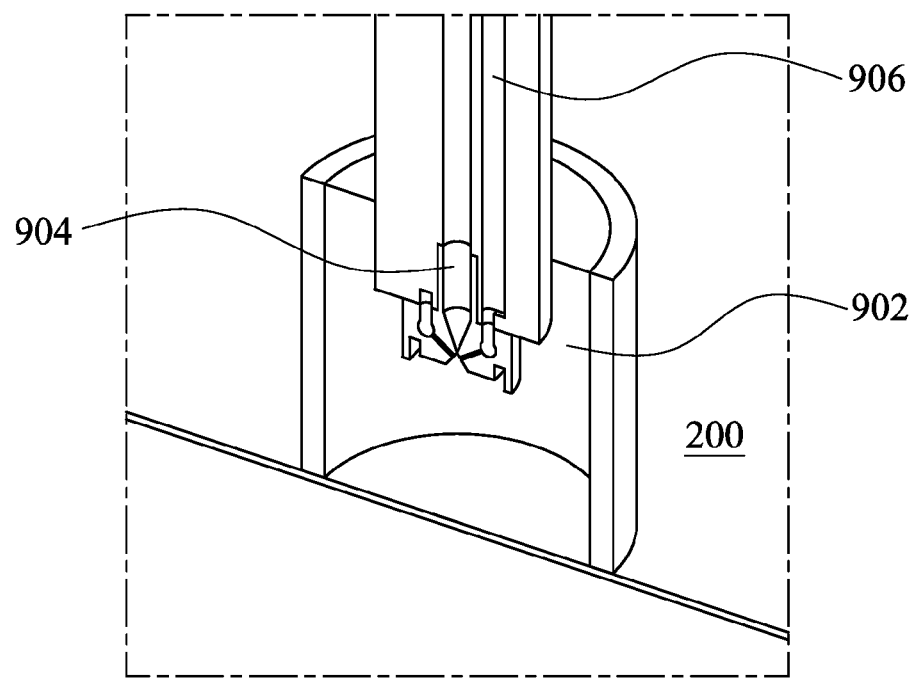
FIGS. 9B and 9C illustrate cross-sectional views of respective portions of the device illustrated in FIG. 9A.

FIG. 9A illustrates a perspective view of the chemical solvent nozzle 102 and the waste chemical solvent absorber 110. A mixing manifold is located within the chemical solvent nozzle 102 and positioned above the thin wafer. FIG. 9B is an enlarged view of the mixing manifold. The mixing manifold includes one mixing channel 902 and two pipes. In accordance with an embodiment, a first pipe 904 supplies chemical solvents. A second pipe 906 supplies nitrogen. At the end of the pipe 906, it has two outlets. One nitrogen outlet is positioned at the right side of the outlet of the pipe 904 and another nitrogen outlet is positioned at the left side of the outlet of the pipe 904. High pressured nitrogen and chemical solvents are fed into the mixing channel 902 and then directed as a dispersed spray onto the thin wafer 200.

Figure 9C:
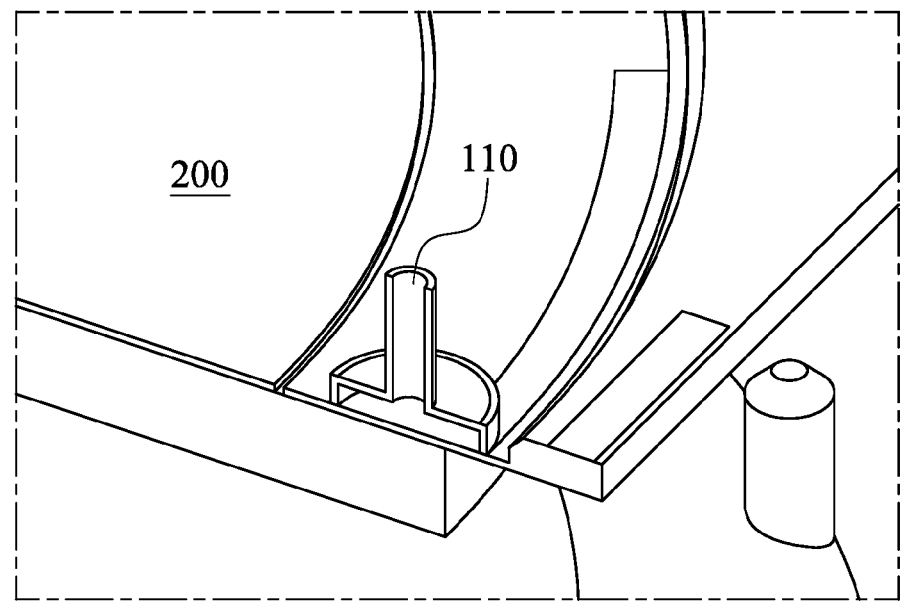

FIG. 9C is an enlarged perspective view of the waste chemical absorber 110. It is placed on top of the tape layer 202. It has an opening through which waste chemical solvents are absorbed and then flow down into a waste drain 908 as shown in FIG. 9A.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device for cleaning a thin wafer comprising:
   a spin chuck comprising:
      a circular shaped plate having at least three extensions spaced along the edge of the circular shaped plate, wherein top surfaces of the at least three extensions are level with a top surface of the circular shaped plate, and bottom surfaces of the at least three extensions are level with a bottom surface of the circular shaped plate;
      a tape layer on the circular shaped plate and a wafer frame on the tape layer;
      at least three holding clamps mounted on the extensions, wherein each holding clamp can be unlocked by placing a non-vertical side of the holding clamp at a first position and can be locked by rotating the holding clamp and placing the non-vertical side of the holding clamp at a second position, wherein the second position is rotated by 180 degrees from the first position, and wherein a distance from an axis of rotation of the holding clamp to a center of the circular shaped plate is greater than a distance from the second position to the center of the circular shaped plate, and wherein the tape layer and the holding clamp are separated by the wafer frame and the axis of rotation is outside the wafer frame; and
a rotational drive shaft connected the circular shaped plate.

2. The device of claim 1, wherein the extensions have a half-oval shape.

3. The device of claim 2, wherein the rotational drive shaft is driven by a motor.

4. The device of claim 3, wherein the speed of the motor is between 500 and 1000 rpm.

5. The device of claim 1, wherein the holding clamp further includes an upper portion and a bottom portion, and wherein the upper portion and the bottom portion form a half-cup shaped holding clamp, and wherein the half-cup shaped holding clamp and a wafer are separated by a wafer frame when the half-cup shaped holding clamp is locked at the second position.

6. The device of claim 5, wherein the lower portion extends substantially orthogonally to the circular shaped plate and the upper portion projects outward from a center of the circular shaped plate when the holding clamp is in the first position and the upper portion projects inward toward the center of the circular shaped plate when the holding clamp is in the second position.

7. The device of claim 1, wherein the circular shaped plate has a diameter of approximately 400 mm.

8. The device of claim 1, further comprising one additional extension and one additional holding clamp wherein all extensions of the circular shaped plate are spaced along the edge of the circular shaped plate and each extension has a holding clamp.

9. A system for cleaning a thin wafer comprising:
a spin chuck comprising:
a circular shaped plate having at least three extensions spaced along the edge of the circular shaped plate and configured to receive thereon a tape layer having a first diameter, wherein top surfaces of the at least three extensions are level with a top surface of the circular shaped plate, and bottom surfaces of the at least three extensions are level with a bottom surface of the circular shaped plate;
at least three holding clamps each having an upper portion and a bottom portion mounted on the extensions, wherein each holding clamp can be unlocked in a first position and can be locked by rotating the holding clamp from the first position to a second position, wherein the second position is rotated by 180 degrees from the first position; and
a rotational drive shaft connected the circular shaped plate; and
a wafer frame mounted on the spin chuck and configured to secure the tape layer, wherein the holding clamp and the tape layer are separated by the wafer frame when the holding clamp is at the second position, and a height of the bottom portion is equal to a height of the wafer frame.

10. The system of claim 9, wherein the wafer frame is ring-shaped with an outer edge having an outer diameter and an inner edge having an inside diameter.

11. The system of claim 10, wherein the outer diameter of the wafer frame is larger than the diameter of the tape layer and the inside diameter of the wafer frame is smaller than the diameter of the tape layer.

12. The system of claim 9, wherein when the holding clamps are locked, the upper portion of the holding clamps prevent the wafer frame from moving vertically.

13. The system of claim 9, wherein when the holding clamps are locked, the bottom portion of the holding clamps is brought into contact with the outer edge of the wafer frame so as to prevent the wafer frame from moving laterally.

14. The system of claim 9, further comprising a tape layer region between the inner edge of the wafer frame and a thin wafer mounted on the tape layer, wherein the tape layer region is non-adhesive.

15. The system of claim 9, further comprising one additional extension and one additional holding wherein all extensions of the circular shaped plate are spaced along the edge of the circular shaped plate and each extension has a holding clamp.

16. A system for thin wafer cleaning comprising:
a spin chuck comprising:
a circular shaped plate having at least three extensions spaced along the edge of the circular shaped plate and configured to receive thereon a tape layer, wherein top surfaces of the at least three extensions are level with a top surface of the circular shaped plate, and bottom surfaces of the at least three extensions are level with a bottom surface of the circular shaped plate;
at least three holding clamps each having an upper portion and a bottom portion mounted on the extensions, wherein each holding clamp can be unlocked in a first position and can be locked by rotating the holding clamp from the first position to a second position, wherein the second position is rotated by 180 degrees from the first position; and
a rotational drive shaft connected the circular shaped plate;
a wafer frame mounted on the spin chuck and configured to secure the tape layer, wherein the holding clamp and the tape layer are separated by the wafer frame when the holding clamp is at the second position, and a height of the bottom portion is greater than a height of the tape layer;
a cup having an inner wall and an outer wall;
at least three spray nozzles attached to the inner wall of the cup and at least three pipes attached to the outer wall of the cup;
a chemical solvent nozzle placed inside the cup and above the spin chuck; and
a waste chemical absorber.

17. The system of claim 16, wherein the chemical solvent nozzle includes a first pipe supplying pressurized chemical solvents and a second pipe supplying nitrogen.

18. The system of claim 16, wherein the chemical solvent nozzle further includes a channel in which the pressurized chemical solvents and nitrogen are mixed.

19. The system of claim 16, wherein the waste chemical absorber is placed on the tape layer.

20. The system of claim 16, wherein the spray nozzles supply air, de-ionized water, surfactant and any combination of thereof.

* * * * *